United States Patent
Delamarche et al.

(10) Patent No.: US 6,893,966 B2
(45) Date of Patent: May 17, 2005

(54) METHOD OF PATTERNING THE SURFACE OF AN ARTICLE USING POSITIVE MICROCONTACT PRINTING

(75) Inventors: Emmanuel Delamarche, Adliswil (CH); Matthias Geissler, Thalwil (CH); Heiko Wolf, Pfaeffikon (CH)

(73) Assignee: International Business Machines Corporation, Armonk, NY (US)

( * ) Notice: Subject to any disclaimer, the term of this patent is extended or adjusted under 35 U.S.C. 154(b) by 188 days.

(21) Appl. No.: 10/307,069

(22) Filed: Nov. 27, 2002

(65) Prior Publication Data

US 2004/0102050 A1 May 27, 2004

(51) Int. Cl.$^7$ .................. H01L 21/302; H01L 21/461
(52) U.S. Cl. ....................... 438/689; 438/686
(58) Field of Search ..................... 438/577, 686, 438/687, 689, 706, 712

(56) References Cited

U.S. PATENT DOCUMENTS

| | | | | |
|---|---|---|---|---|
| 5,079,600 A | * | 1/1992 | Schnur et al. | 357/4 |
| 5,512,131 A | * | 4/1996 | Kumar et al. | 438/738 |
| 6,180,288 B1 | * | 1/2001 | Everhart et al. | 430/2 |
| 6,413,587 B1 | * | 7/2002 | Hawker et al. | 427/264 |
| 6,436,699 B1 | * | 8/2002 | Berggren et al. | 435/287.2 |
| 6,518,168 B1 | * | 2/2003 | Clem et al. | 438/623 |

* cited by examiner

Primary Examiner—David Nhu
(74) Attorney, Agent, or Firm—F. Chau & Associates, LLC

(57) ABSTRACT

There is disclosed a method of patterning an article (10) including a layer (12) of copper formed onto an insulating substrate (11) using a positive microcontact printing (MCP) process. In a preferred embodiment where the metal is copper (Cu) and the substrate is a silicon wafer, the method includes removing the native oxide presents on the Cu in a solution of HCl. Then, a stamp (13') having a patterned polydimethylsiloxane (PDMS) body (14) is linked with a 0.2 mM solution of pentaerythritol-tetrakis(3-mercaptopropionate) (PTMP) in ethanol for 1 min, to form the inking layer (15'). The stamp is applied on the Cu layer to print a first self-assembled monolayer (SAM) (16') according to a desired pattern. The article is dipped in a solution of ECT which is then adsorbed only in the non printed regions, forming a second SAM (18) in a configuration that is complementary to the desired pattern. Finally, the printed areas of the Cu layer are removed using a peroxodisulfate etch bath.

15 Claims, 2 Drawing Sheets

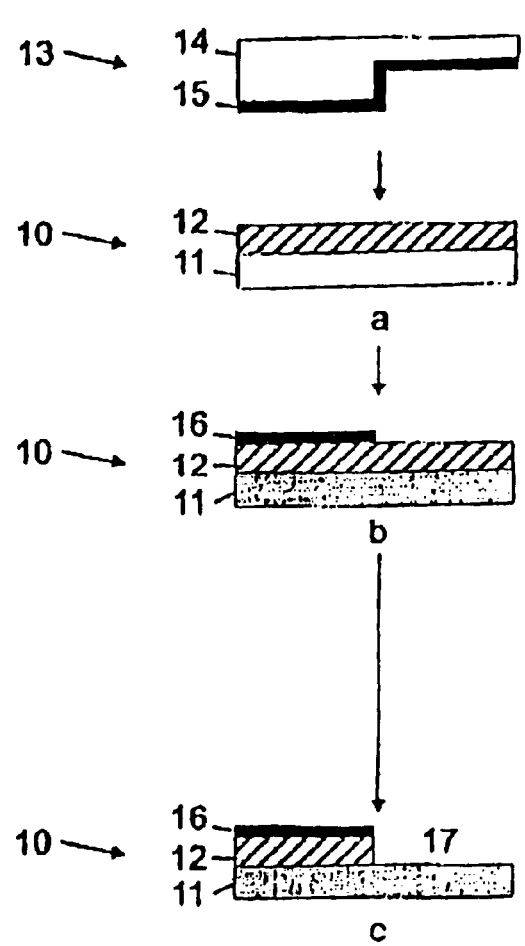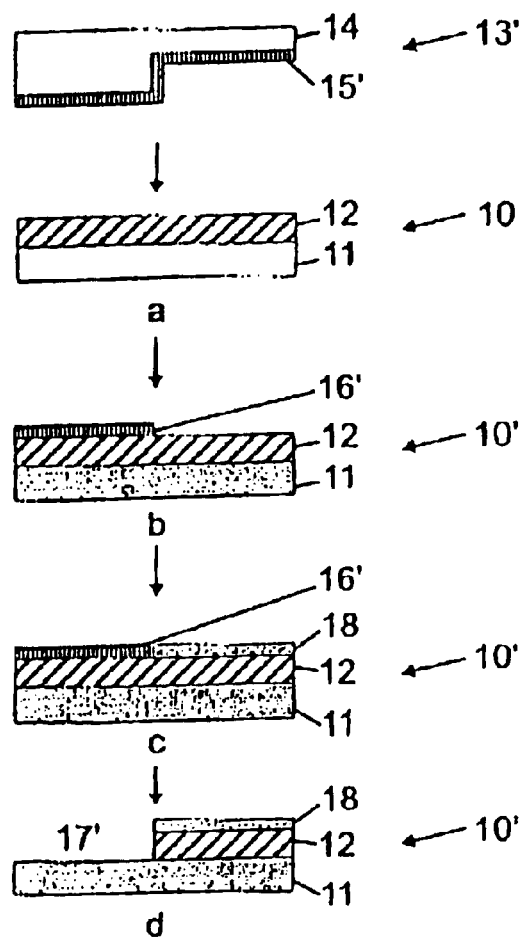
FIG. 1
(Prior Art)
FIG. 2

METHOD OF PATTERNING THE SURFACE OF AN ARTICLE USING POSITIVE MICROCONTACT PRINTING

FIELD OF THE INVENTION

The present invention relates to advanced lithography techniques and more particularly, to a microcontact printing process of the positive type and a method of patterning the surface of an object using said microcontact printing process of the positive type.

BACKGROUND OF THE INVENTION

Conventional lithography encompasses a number of techniques. Photolithography is an important technique that is widely used for the fabrication of microstructures, such as semiconductor devices. Basically, it is usually performed as follows. First, a solution of photosensitive polymeric type of material dissolved in a solvent is spin-coated onto a substrate to form a homogeneous layer of a controlled thickness. Second, the substrate covered with the photoresist layer is heated to eliminate most of the solvent and the photoresist is selectively exposed to light using a patterned optical mask to block light where desired. Ultraviolet light is usually employed and its interaction with the photoresist material alters its physical or chemical properties in the exposed area in a manner sufficient to differentiate between exposed and non exposed areas of the photoresist during a subsequent development step. The photoresist can be of positive tone, wherein case it dissolves during the development step where it is exposed to light (i.e. the substrate can be etched in the exposed regions) or alternatively, it can be of negative tone and dissolve where it is not exposed to light (i.e. The substrate can be etched in the non-exposed regions). The photoresist, once patterned, acts as a protective mask to prevent local etching of the substrate. Once the image of the pattern is transferred into the substrate, the photoresist can be removed or stripped. Because, photolithography is usually performed under very clean and controlled environments, it is an expensive but powerful technique well suited for mass fabrication of structures and devices having lateral dimensions ranging from a few millimeters to less than 100 nanometers. The contrast and resolution of patterns made using photolithography should be as high as possible because it is not desirable to have some photoresist left in regions where the substrate should be etched away.

Other types of lithographic techniques follow the principle of patterning a resist to pattern a substrate but without using light. Electron-beam (e-beam) lithography, for example, uses a focused beam of electrons to write the desired image into an electron-sensitive resist. The image written in the resist is also developed in a subsequent step. In contrast to photolithography, e-beam lithography is not writing the image in the resist at once but it scans the beam over the resist to generate the elements of the pattern in a serial manner. E-beam lithography is consequently slower than photolithography but it has better resolution possibilities well below 100 nm. E-beam lithography is used for example for fabricating optical masks for use in photolithography. Electron beam resists can be of the negative or positive type. Positive e-beam resists are depolymerized by the beam of electrons and the written parts of the resist dissolve away during the development of the written image. Conversely, the regions of a negative e-beam resists which are written are polymerized and they are not dissolved away during the development step. Since e-beam lithography is a slow and expensive patterning technique, it is important to use either a positive type or negative type of resist depending upon the application to minimize the writing time. A pattern comprising a limited number of small structures is written faster using a negative type of resist because the writing operation produces a line of resist which can be transferred directly into the substrate. To fabricate the same line using a positive resist, it would be necessary to write a large area of the resist with the e-beam, omitting to write this line in the resist.

A technique called lift-off is an interesting strategy to invert the pattern of a developed resist. The lift-off technique can be used in photolithography and e-beam lithography. In lift-off, a resist is patterned first and a metal is then deposited over the patterned resist. The resist is subsequently removed together with the metal present on top of it. This technique is interesting because it can yield an overall negative process using a positive resist, but it has an inherent limited resolution and contrast. The fabrication of optical masks with e-beam lithography is not done using the lift-off technique for example.

There also exist other types of advanced lithographic techniques used or developed in research centers including those based on writing an image in a resist using X-rays or extreme UV light that are explored for achieving high resolution patterning of resists or for patterning very thick resists. However, among these advanced lithography techniques, the microcontact printing appears by far, one of the most promising and versatile.

Microcontact printing (MCP) utilizes an inked, micropatterned stamp to print chemicals or biomolecules onto a substrate. The most important application of MCP is the printing of alkanethiols onto Au, Ag or Cu substrates to form a self-assembled monolayer (SAM) in the regions of contact between the stamp and the substrate. The stamp is generally made from an elastomer such as polydimethylsiloxane (PDMS). PDMS polymers are commercially available under the trademark Sylgard (e.g. Sylgard 182, 184 and 186) manufactured by the Dow Coming Company, Midland, Mich. The PDMS stamp is replicated from a mold (typically a silicon wafer having a photoresist pattern formed thereon). The PDMS stamp is inked with a solution of SAM-forming molecules and dried to remove the solvent used to prepare the ink. The stamp is then placed onto the substrate to form a SAM in the printed regions of the substrate. It is possible to use the printed SAM as a patterned resist layer for selectively etching a substrate. In this case, the printed SAM protects the substrate from dissolution in an etch bath.

As a matter of fact, the material constituting the SAM when the latter plays the role of a resist layer, is quite different from conventional polymeric resists. First, a SAM forms spontaneously on different types of substrate and thus it does not need to be spin coated on a surface. For instance, the brief immersion of a gold substrate into a solution of alkanethiols diluted in ethanol leads to the formation of a SAM on the gold substrate. Second, a SAM is usually thin, about the length of one of its molecule or just a few nanometers thick. Finally, the etch system for patterning a substrate having a patterned SAM formed thereon must be carefully selected whereas conventional resists tend to protect well their substrates against many types of etchants. A relatively thin SAM can protect a substrate from dissolution in a wet etch bath provided that it has a good order and density over the substrate and that the etch bath is selective. A well-known example is the patterning of a gold substrate using a SAM of hexadecanethiol and a cyanide-containing etch bath. As an example, 0.5 ml of a 0.2 mM solution of hexadecanethiol in ethanol can be placed using a pipette onto the surface a 1 cm² patterned PDMS stamp. The solution is left on the stamp for 30 s and then blown away with a stream of nitrogen. The stamp is dried with the stream of nitrogen and it is placed by hand onto the surface of a 20-nm-thick Au layer on a Si wafer. The contact between the stamp and the substrate enables the transfer of molecules of hexadecanethiol from the stamp to the substrate in the printed areas where the molecules chemisorb to the Au and form a SAM. A typical contact time is 10 s. The stamp is then removed by hand and the printed Au substrate is patterned using a selective wet etch bath: the printed SAM protects the Au from dissolution in an alkaline (pH of 12 or more) solution of water containing potassium cyanide and dissolved oxygen. After etching of the Au in the non printed regions, the patterned Au layer on the Si wafer is removed from the bath, rinsed with water and dried. Typical molecules for the ink are hexadecanethiol or eicosanethiol dissolved in ethanol. As a consequence, the materials forming such SAMs have recently sparked a lot of interest in the research community for their usage as high resolution resists: they have well defined chemical compositions, they are simple to prepare and of easier use than conventional resists. Finally, it is inexpensive to form SAMs on the surface of substrates and, moreover, SAMs can be patterned with a great variety of techniques.

Patterning of SAMs has been demonstrated using UV light and an optical mask to oxidize selectively molecules in a SAM. In these examples, the oxidized molecules lose their binding capability with the substrate so that they can be washed away from the surface in a subsequent rinsing step (see e.g. Tam-Chang et al., Langmuir 1996, vol. 11, p4371–4382).

Removing parts of a SAM with light and etching the substrate in the regions which are exposed to light correspond to a positive type of lithographic process. This work is severely constrained, however, by the instability of the SAM before it is photopatterned. This SAM is formed of short molecules which are sensitive to ambient light and unstable under standard laboratory conditions. Oxygen from air and stray light oxidize readily the sulfur moiety of the molecules in a monolayer, which lead to their easy removal in solution. This SAM has limited thermal stability, additionally. The lost molecules in the first SAM left regions of the substrate uncovered and resulted in the insertion of molecules of the second SAM. Since the second SAM forms the resist, it blocks the etch of the substrate in the regions where it is inadvertently inserted. This resulted in a poor contrast of the patterns of the etched substrate.

Patterning of SAMs has also been demonstrated by using the electrons of an e-beam microscope or of a scanning tunneling microscope to disrupt locally molecules in a SAM. The mechanism of interaction between the electrons and the molecules forming the SAM is not well known but the substrate can eventually be etched away in the written regions if an appropriate etch is used (see e.g. Lercel et al., J., Vac. Sci. Technol. B 1995, vol. 13, p1139–1143). In this case, the SAM material is used as a positive type of resist and the overall lithographic process is positive as well (the substrate is etched where the pattern is written). An attempt to pattern surfaces using an inverted process is done by Delamarche et al. (see e.g. Delamarche et al. J. Phys. Chem. B 1998, vol. 102, p3324–3334). In this work, the approach is similar to that of Tam-Chang et. but molecules forming the first SAM are removed using an electron beam instead of ultraviolet light. The same problems occur: the first SAM is too unstable under ambient conditions and tends to be exchanged by too many molecules during the formation of the second SAM in undesired areas.

Patterning a SAM has also been demonstrated on small length scales using mechanical indentation (see e.g. Abbott et al. Science 1992, vol. 257, p1380–1382). The blade of a scalpel or the tip of an atomic force microscope or of a scanning tunneling microscope can be used to damage and remove a protective SAM locally. An etching step can then transfer the written pattern into the substrate. The SAM forming material and the overall lithographic processes are of the positive type in this example. It can be desirable to employ an inverted process wherein a mechanical indentation would remove parts of a non-blocking etch SAM and to place an etch-blocking SAM in the indented areas. FIGS. 1a–1c shows the sequence of processing steps of the conventional method of patterning the surface of an object when the standard MCP process is used. As mentioned above, according to the standard MCP process, a SAM (playing the role of a masking resist layer) is printed on the object using a patterned rubber stamp.

Now turning to FIG. 1a, an object 10 comprises a substrate 11 coated by a layer 12 of a material to be selectively etched. The substrate 11 may be a silicon wafer and the layer 12 forming material can be made of gold (Au). A stamp 13 comprises a PDMS body fabricated from a mold to have a desired configuration, and a patterned layer 15 comprising an ink. Typically, the material forming the ink is eicosanethiol (ECT). The stamp 13 is applied to the object surface causing the formation of a self-assembled monolayer, also referred to as SAM 16 showing the same pattern as the printing area on the stamp 13. Finally, the object 10 is etched, for instance in a chemical bath to dissolve the gold at a location 17. The SAM 16 functions as a blocking in-situ resist layer to protect the gold layer 12 underneath. FIG. 1c shows that the gold layer 12 is etched everywhere it is exposed to the etchant from the bath. As apparent in FIG. 1c, the substrate 11 is protected where the SAM 16 was printed.

This standard MCP process has a few drawbacks and inherent limitations that will be discussed now.

Mechanical stability of the patterns on micropatterned stamps is a major problem. Stamps having small structures separated by long gaps (zones which should not come into contact with the substrate) are mechanically unstable. Gaps must be stabilized using supportive posts, or stamps must be fabricated using a harder elastomer. But stabilizing posts also print a SAM on the substrate and prevent etching the substrate in these regions. This can interfere with the layout of an electrical circuit or can create light absorbing zones where maximum transmission of light is desired, for example. Fabricating harder stamps might not be desirable in particular for printing on rough substrates or on substrates having already some structures present before printing because in these cases, the stamp would be too hard to deform enough to match well the topography of the substrate. It may be possible to fabricate a stamp with deepened structures to improve the stability of the gap regions of a stamp. However, in this case, a deep mold would be required, which might be difficult or expensive to fabricate. A reactive ion etcher is generally used to prepare such deep molds.

High-resolution lines on a stamp can be difficult to unmold, because lines and posts on PDMS stamps can break and detach when a stamp is peeled off a high-resolution master or if the structures are large but have a unfavorable geometry.

The time necessary for printing a SAM on a surface (of the order of a few seconds for 1-cm-large stamps up to several minutes for 15"-long stamps) is another important issue for technological applications of negative MCP. There are essentially two manners to place a stamp on a surface. In the first manner, the stamp is planar and brought gradually in contact with the substrate from one side, which ensures a controlled and well-propagating contact. This can be done by hand or using sophisticated tools. In either case, the stamp can be left in contact with the substrate for times ranging from seconds to minutes. Since one side of the stamp is placed first and removed last, the printing time can vary greatly from one side to the other. This results in different degrees of completion of the printed SAM, i,e. a side of the substrate will be more protected in the etch bath than the other and it would thus exist a gradient of varying protection from one side to the other. This can be another major problem for patterning a substrate because the SAM should be as homogenous and protective as possible everywhere. The second type of printing tool is using rolls or cylindrical stamps. It is relatively easy to have a homogeneous printing time with these tools but it is difficult to have long enough printing time to form well protective SAMs because the contact between the stamp and the substrate takes place only in a small area at a time.

In addition, it seems difficult, if not impossible, to print a molecule to form a SAM which is not compatible (swells, damages, cannot be inked, . . . ) with a stamp. This is unfortunate when the molecules forming the best monolayer on the substrate for a given application might not be forming a good or practical ink.

Finally, the above MCP process lacks flexibility. The standard MCP process described by reference to FIGS. 1a–1c, resembles to a negative type of lithography because the SAM plays the role of a resist layer which protects the substrate from etching in the regions where it is printed. It will thus be referred to hereinbelow as the negative MCP. Up to now, negative MCP has been used to print a SAM where the substrate needs to be protected, but obviously it could be also desirable to have the inverted process wherein the printed regions of the substrate would be etched away. In other words, it would be desirable to have the possibility of using SAMs for negative and positive types of lithography for many reasons, including reasons already known in conventional photolithography. It can be desirable to photopattern a SAM positively or negatively to obtain the best possible contrast and resolution for a specific pattern. It can be also advantageous to use one mask only to form positive or negative images of this mask by using a negative or positive type of SAM resist. It is further desirable to minimize the time necessary for writing a pattern in a SAM when slow and expensive patterning methods such as electron-beam lithography, atomic force microscopy, or scanning tunneling microscopy are used. The writing time in these techniques would be greatly decreased by using a positive or negative type of lithography using a SAM depending on the pattern.

In summary, the above described negative MCP process has the inconveniences and inherent limitations that are recited hereunder.

a. First of all, some micropatterned stamps are mechanically unstable because some of their features collapse during printing and areas of the stamp which should not come into contact with the substrate in fact print. To improve the stability, a mold with deep structures is fabricated to prevent sagging of parts of the stamp during the printing operation. Because, a reactive ion etcher is employed for this purpose, standard negative MCP processes are complex and expensive.

b. High-resolution lines on a stamp can be difficult to unmold.

c. Large substrates are long to print and the printing time is not homogeneous across the substrate. Consequently, with conventional negative MCP processes, SAMs printed over large substrates have different quality which leads to problems during the etch step subsequently performed.

d. It seems difficult, if not impossible, to print a thiol which is not compatible with a stamp material.

e. Finally, it would be highly desirable to have a positive MCP process for maximum flexibility.

No positive version of the above described standard negative MCP process has been known so far, although it would have been highly desirable to have both options like for any standard lithographic process. Such a novel approach of the MCP would not only correct some of the above drawbacks but would also offer a number of inherent advantages. A first result would be to have a maximum of flexibility for the fabrication of the mold and of the stamp, because it would be simpler and more economical to use directly a resist patterned on a substrate as the mold. Using a positive MCP process would solve the problem of stability of structures on stamps: large mechanically unstable gaps would become large printing areas and the areas of the substrate protected from etching would be the non printed areas. Finally, using a positive MCP process could solve the problem of having variable printing time (case of printing with planar stamps) or too long printing time (case of printing with a roll) by printing a SAM-forming compound which shall not be used as a resist but which shall block locally the formation of the resist-forming SAM in a subsequent step. Therefore, the SAM used as an etch resist could be patterned by depositing it in the regions complementary to the printed regions with optimal operating conditions on parameters such as time, solvent, concentration, temperature, and so forth.

The inventors have thus developed such a positive MCP process which not only solves the above mentioned problems of the standard negative MCP process but also opens new opportunities to the MCP technique. An application of this positive MCP process to an improved method of patterning the surface of an object will also be described.

SUMMARY OF THE INVENTION

According to a first aspect of the present invention a printing process of a positive type is provided.

According to a second aspect of the present invention is provided a printing process of the positive type wherein the structures formed on the stamps have better mechanical stability.

According to a third aspect of the present invention is provided a microcontact printing process of the positive type which allows to fabricate more stable patterns on the stamp without requiring the use of a reactive ion etcher (RIE), thereby reducing both cost and process complexity.

According to a fourth aspect of the present invention is provided a microcontact printing process of the positive type wherein high-resolution lines on a substrate are produced using high-resolution grooves on the stamp, allowing easier unmolding.

According to a fifth aspect of the present invention is provided a microcontact printing process of the positive type which allows a faster print operation on an object for higher manufacturing throughput.

According to another aspect of the present invention is provided a microcontact printing process of the positive type which allows a print operation on the object to be substantially homogeneous all across the object surface.

According to yet another aspect of the present invention is provided a microcontact printing process of the positive type that allows to pattern a thiol indirectly on a surface which is not compatible with the stamp material.

According to yet another aspect of the present invention is provided a method of patterning the surface of an object using such a printing process of the positive-type.

According to the present invention there is described a method of patterning the surface of an object comprising the steps of:
a) providing an object comprising a substrate having at least one layer formed thereon having a surface to be etched;
b) forming a first SAM on the layer according to a desired pattern of a first material capable of binding to said layer;
c) forming a second SAM of a second material on the exposed regions of the layer in a configuration that is complementary to said desired pattern; and,
d) etching the layer through said first SAM but not in the regions thereof that underlies the second SAM;
wherein the first material prevents the formation of the second material on the first SAM but does not block the etching of the underlying regions of the layer therethrough.

Therefore, with the present invention, both positive and negative types of the MCP process are now available for patterning the surface of an object.

The features believed characteristic of this invention are set forth in the appended claims. The invention itself, however, as well as other objects and advantages thereof, may be best understood by reference to the following detailed description of an illustrated preferred embodiment to be read in conjunction with the accompanying drawings.

BRIEF DESCRIPTION OF THE DRAWINGS

FIG. 1 comprised of FIGS. 1a–1c illustrates the essential steps of the standard negative MCP process in an application to the patterning of a gold covered silicon substrate.

FIG. 2 comprised of FIGS. 2a–2d illustrates the essential steps of the innovative positive MCP process of the present invention, still in a similar patterning application.

DESCRIPTION OF A PREFERRED EMBODIMENT

Figure 3:
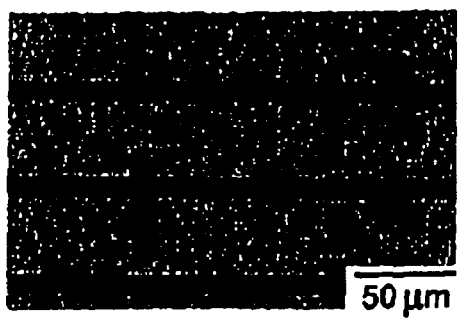
FIG. 3 shows the scanning electron microscope image of a 20-nm-thick Au layer which is evaporated on a silicon wafer and patterned using the positive MCP according to the present invention.

A preferred embodiment of the positive MCP process according to the present invention will be now described by reference to FIGS. 2a–2d. The illustrations are not necessarily drawn to scale. In addition, like reference numerals (with prime) are used in FIGS. 1a–1c and 2a–2d to designate identical (corresponding) parts.

A first embodiment is conducted with a same object as used in the standard negative MCP described above by reference to FIGS. 1a–1c. Object 10 thus still comprises a 20-nm-thick Au layer 12 which is evaporated using an electron-beam evaporator on a silicon wafer substrate 11 having a film (20 nm) of native oxide. A 1-nm-thick layer of Ti which plays the role of an adhesion promoter is also evaporated therebetween as standard. In FIG. 2a, there is shown a micropatterned stamp 13' comprising a PDMS body 14 inked with a 0.3 mM solution of pentaerythritol-tetrakis (3-mercaptopropionate) (abbreviated PTMP) in ethanol for 1 min to form the stamping pattern 15'. After the stamp 13' is blown dry, e.g. using $N_2$, it is applied onto the substrate surface with the layer 12 and the conformal contact between the stamp 13' and the layer 12 ensures substantially homogeneous transfer of PTMP molecules to the layer 12. The print lasts for 30 s before the stamp 13' is removed resulting in the formation of a SAM 16' of PTMP in the printed regions as shown in FIG. 2b. Printing and removing the stamp 13' can be done by hand or also using tools or precise instruments such as a printer or mask aligner. The object 10 is then immersed in a 0.6 mM solution of ECT in ethanol for 15 s. As apparent in FIG. 2c, during this step, ECT forms an etch-protective SAM 18 on the Au layer 12 except where the PTMP layer 16' is printed. The Au layer 12 is then etched selectively at a location 17' in a 0.1 M cyanide (KCN) bath buffered in KCl/NaOH buffer at pH 12.0 for 25 min. The final structure is shown in FIG. 2d.

FIG. 3 shows a scanning electron microscope image of a patterned Au layer wherein the parts of the Au layer printed with PTMP were removed while the parts covered with ECT remained.

The second embodiment demonstrates the feasibility to produce patterns in a Cu layer. In this case, the object 10 now comprises a silicon wafer as the substrate 11 having a 1-nm-thick titanium layer formed thereon as an adhesion promoter coated with a 100-nm-thick copper (Cu) layer 12 deposited in an electron-beam evaporator. The high conductivity of Cu makes it a good material for forming conductive patterns atop semiconductor structures. Because Cu exposed to ambient conditions tends to oxidize, the 100 nm thick copper (Cu) plated substrate is first immersed in 4% HCl in deionized (DI) water for 10 s to remove native copper oxide, then removed. Next, the object 10 is copiously rinsed with DI water and dried with a stream of $N_2$. Now, according to the present invention, the PDMS stamp 14 is inked with a 0.2 mM solution of PTMP in ethanol for 1 min, to form a stamping pattern 15' thereon, as shown in FIG. 2a. The Cu layer 12 is printed with the stamp 13' forming the first SAM 16', shown in FIG. 2b. Object 10 is then immersed in a 0.3 mM solution of eicosanethiol (ECT) in ethanol for 4 min. The purpose of this step is to deposit eicosanethiol in the non-printed areas as apparent in FIG. 2c and form the second SAM 18. Object 10 is removed from the bath, rinsed with ethanol and dried with a stream of nitrogen. Finally, the object 10 is immersed in a bath of 0.07 M peroxodisulfate in deionized water for 2 min 30 s, then rinsed with deionized water and dried with a stream of nitrogen. At this stage of the patterning process based on a positive MCP process, the object 10 is shown in FIG. 2d. As apparent in FIG. 2d, only the printed regions of the Cu layer 12 are etched away at the loction 17'.

A third embodiment demonstrates the possibility of forming patterns on the 100-nm length scales. In this case, object 10 consists of a silicon wafer (having a 1 nm thick titanium layer formed thereon as an adhesion promoter) coated with a 50 nm thick copper (Cu) layer 12 deposited in an electron-beam evaporator. The Cu surface is treated as it is done in the previous example for removing the native oxide present on the Cu surface. Then, according to the present invention, the PDMS stamp 14 is inked with a 0.1 mM solution of PTMP in ethanol for 1 min, to form stamping pattern 15', as shown in FIG. 2a. The Cu layer 12 surface is printed with the stamp 13' forming the first SAM 16', shown in FIG. 2b. Object 10 is then immersed in a 0.6 mM solution of eicosanethiol (ECT) in ethanol for 2 min. The purpose of this step is to deposit eicosanethiol in the unprinted areas as apparent in FIG. 2c and form the second SAM 18. Object 10 is removed from the bath, rinsed with ethanol and dried with a stream of nitrogen. Finally, the object 10 is immersed in a bath of 0.07 M peroxodisulfate in deionized water for 3 min, then rinsed with deionized water and dried with a stream of nitrogen. Again, the positive MCP process is used to produce the object 10 as shown in FIG. 2d wherein the printed regions of the Cu layer 12 are etched away at the location 17'.

Figure 4:
FIG. 4 shows the scanning electron microscope image of a 100-nm-thick Cu layer which is evaporated on a silicon wafer and patterned to form lines of different shapes using the positive MCP according to the present invention.
Figure 5:
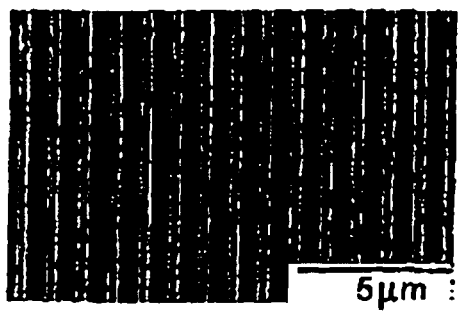
FIG. 5 shows the scanning electron microscope image of a 50-nm-thick Cu layer which is evaporated on a silicon wafer and patterned to form narrow Cu nanowires still using the same operating conditions as performed in FIG. 4.
Figure 6:
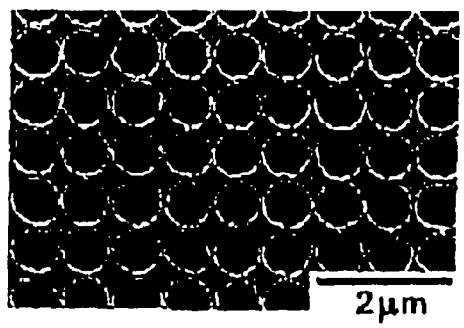
FIG. 6 shows the scanning electron microscope image of a 50-nm-thick Cu layer which is evaporated on a silicon wafer and patterned to form minute holes in a Cu layer still using the same operating conditions as performed in FIG. 4.

FIGS. 4, 5 and 6 are scanning electron microscope images which show different Cu patterns resulting from this embodiment. As apparent from the images, the contrast and accuracy of the formed patterns is high, the silicon substrate appearing in the dark areas of the image where Cu is microcontact printed and etched away. FIG. 4 shows different shapes of lines that can be obtained. FIG. 5 shows narrow Cu nanowires that are fabricated using a stamp with high-resolution features. The nanowires have typical dimensions smaller than 200 nm clearly illustrating thereby the high-resolution capability of the positive MCP process of the present invention. FIG. 6 shows a pattern of microholes that have been etched into the Cu layer. It is particularly difficult to form such a pattern with negative MCP because some of the ECT molecules present on the stamp diffuse away from the printing areas towards the holes (the non printed areas) and reduce strongly the dimensions of these holes. The diffusion during printing of molecules such as PTMP is not a problem for fabricating these structures.

In still another embodiment, cysteamine is used to form stamping pattern 15' to structure a 50-nm-thick Cu surface evaporated onto a silicon wafer. The native oxide present on the Cu surface is removed with an acid as explained in the preceding examples. First a PDMS micropatterned stamp is hydrophilized using an oxygen plasma treatment and then the hydrophilic stamp is inked with cysteamine (in the form of its hydrochloride salt) with a concentration of 0.5 mM in ethanol. Hydrophilization of the PDMS stamp ensures a good affinity between the oxidized PDMS surface and the polar cysteamine molecules from the ink. The inked stamp is printed onto the Cu surface to pattern cysteamine on the surface of the Cu layer. The print lasts approximately 20 s before the stamp is removed by hand from the substrate. The printed substrate is then immersed into a 0.6 mM solution of ECT for 2 min. During this step, a SAM of ECT forms in the non printed areas of the Cu surface. After removing the substrate from the ECT solution, rinsing it with 20 ml of ethanol and drying it with a stream of nitrogen, the Cu in the printed regions is etched in a solution of peroxodisulfate at room temperature for a few minutes until the Cu in the printed areas is entirely etched. Positive MCP using cysteamine works with Au substrates as well, wherein case a cyanide etch bath is used to selectively etch the printed gold layer. The printed regions of the substrates which are covered with cysteamine (a hydrophilic-forming SAM) and the regions covered with ECT (a hydrophobic-forming SAM) created a high-contrast and stable dewetting pattern: if a few drops of water are placed on the Au surface having a pattern of cysteamine and ECT (no etch step is used to structure the Au layer in this case), the water migrated to the hydrophilic regions and is absent from the hydrophobic regions of the Au.

The present invention here develops a positive MCP process wherein the printed SAM blocks the deposition from solution of a resist-forming SAM but does not block the etchant. Positive MCP thus relies on printing a first SAM 16' which does not block the etching of the substrate but which substantially blocks the deposition of the second SAM 18 that functions like a resist-forming monolayer.

When choosing the molecules to build the second SAM 18, they can be of the same type of chemicals as are usable for the standard negative MCP process, such as long chain alkanethiols. In contrast, the choice for the molecule to be printed to form the first SAM 16' and defining the conditions for positive MCP are rather difficult due to the necessity of meeting severe requirements. The material forming the first SAM should be inkable and compatible with stamps made in polydimethylsiloxane (PDMS). It should be permeable to the etchant, and it preferably should not retard the etch for too long. It should not be too diffusive in order not to blur the prints, but it should remain localized in the printed regions of the substrate. Moreover, it should form a dense monolayer consecutively to its printing to prevent the insertion of the molecule forming the second SAM and it should not be replaced by it, but rather should form a stable monolayer.

It was found out that an adequate material to form the first SAM could be the pentaerythritol-tetrakis(3-mercaptopropionate) compound (PTMP). This oligothiol having the formula $C(CH_2-O-CO-CH_2-CH_2-SH)_4$ is commercially available. It has a molecular weight large enough to minimize its diffusion characteristics for printing operations. It is capable of complexing Au layers (as well as Ag, Cu and Pd layers) with several —SH anchoring groups which confers it an excellent stability in the chemisorbed state. This prevents exchanging it by molecules used to form the first SAM after the printing step. This molecule is soluble enough in ethanol to prepare an ink compatible with stamps. It is deemed to be printed more quickly, because it is a multivalent ligand for substrates. The permeability of PTMP to several etchants which the inventors tried is in fact surprising and might be due to the small size of PTMP and to the scission of the PTMP molecules (in a SAM) by hydrolysis of their ester bonds. More generally, molecules with at least 2 thiol groups or molecules with at least 2 thiol groups and alkyl chains attached to either thiol having 6 or less than 6 consecutive C atoms are adequate materials to form the first SAM 16'. Other molecules having only one thiol and a chain attached to this thiol should in principle not be suitable for positive MCP because they either form too unstable SAMs when the chain is too short or they block the etchant when the chain is too long. Cysteamine (HS—$CH_2$—$CH_2$—$NH_2$.HCl) is successfully employed for positive MCP. The hydrochloric salt of cysteamine is polar and a SAM of these molecules on a surface probably repulses ECT molecules from solution for this reason. Due to the polar nature of cysteamine in its hydrochloric salt form, PDMS stamps are treated to render the surface of stamps hydrophilic before inking them with a solution of cysteamine hydrochloric salt in ethanol. Molecules having one thiol and an alkyl chain having at least 2 but less than 12 consecutive C atoms and at least one ionizable polar group such as an amine are adequate to form the first SAM 16'.

The positive MCP process of the present invention solves the above mentioned problems and limitations of the prior art.

a. With this positive MCP process, lines can be produced by printing the areas between the lines. Fabricating an array of lines which are separated by larger distances does not require the fabrication of mechanically more stable stamps, such as stamps made from a harder rubber or having support posts. Because, the mold is only patterned with a thin photoresist, the positive MCP process of the present invention is thus simpler and more economical than the conventional negative MCP process.

b. Stamps for positive MCP suffer less from the unmolding problems mentioned above since the structures would be indented in the more stable mold.

c. As mentioned above, using the conventional negative MCP process, larger substrates are longer to print (3 min for a 15" square plate). This is no longer a problem because the printed monolayer does not need to be a "perfect" resist but it only blocks the formation of a substantially closed resist-monolayer. For this reason, the positive MCP process of the present invention is considerably faster than said conventional negative MCP technique.

d. As far as thiols are concerned, the positive MCP process offers a chance to use novel thiols for protecting a substrate from an etchant, which are not compatible with POMS stamps.

e. Finally, the positive MCP process of the present invention offers the desired flexibility to the circuit designer, because the same type of stamp can be used to produce positive or negative patterns. This is useful to fabricate patterned substrates and molds using the same stamp.

In the above description, the object 10 comprises a metal (e.g. Cu or Au) coated silicon wafer, the first SAM is formed by standard negative MCP but using a stamp inked with PTMP instead of ECT and the second SAM is formed by depositing ECT in solution. However, it must be understood that either SAM can be printed and the other, placed in the non printed regions, can be deposited from a solution (see e.g. Kumar and Whitesides Science 1994, vol. 263, p60–62). This is used for creating wetting patterns, i.e. one SAM material renders the surface hydrophobic and the other one renders it hydrophilic; in this application, the quality of the SAM material does not influence profoundly the wetting properties. If molecules of one SAM material are present in the other, the wetting properties are usually not lost whereas the ability to etch or block an etch are much more sensitive to having imperfect SAMs. Because of this problem, the wetting pattern formed by two SAMs on a surface is used to deposit a relatively thick polymeric layer on one of the two. This polymeric layer can be then used to block etching of the substrate (see e.g. Whitesides et al. WO 96/29629). This method has two main disadvantages. First, it adds a number of steps between patterning the SAMs on the surface and having the resulting etched substrate. These steps are placing a solution of the polymer on the surface having the patterned SAMs, creating the dewetting pattern of polymer by spin-coating, evaporating the residual solvents from the polymer, etching the substrate except where the polymer is placed and removing the polymer. Adding steps to a lithographic process results in a more expensive process and/or a process with inferior yield. Second, the polymer placed on one of the patterned SAM is prone to surface tension, i.e. it has a rounded shape but it does not have a homogeneous thickness or sharp corners. This can compromise the resolution of the patterns formed in the substrate.

Moreover, the above described positive MCP process is generally applicable to other SAM forming materials and different type of objects (layer/substrate). Likewise, the formation of said SAMs can be performed by a number of different techniques. Because of this wide potential of generalization, the positive MCP process of the present invention opens a considerable avenue for new research/industrial applications.

It will be apparent to those skilled in the art that various modifications may be made in the process and products illustratively described therein, without departing from the spirit or scope of the invention as expressed in the following claims.

What is claimed is:

1. A method of patterning the surface of an object comprising the steps of:
   a) providing an object comprising a substrate having at least one layer formed thereon;
   b) forming a first SAM on the layer according to a desired pattern of a first material capable of binding to said layer;
   c) forming a second SAM of a second material on a region of the layer that is not covered by said first SAM, in a configuration that is complementary to said desired pattern; and,
   d) etching the layer through said first SAM;
   wherein the first material is selected to prevent the formation of the second SAM on the first SAM and to substantially not block the etching of an underlying region of the layer therethrough.

2. The method of claim 1 wherein said step of forming the first SAM comprises depositing the first material using negative MCP using a stamp comprising an elastomer body provided with an inking layer of said first material.

3. The method of claim 1 wherein said step of forming the first SAM comprises depositing the first material using a writing technique to localize the formation of the first SAM.

4. The method of claim 1 wherein said step of forming the first SAM comprises depositing the first material from a solution on the substrate and forming the first SAM by removing the first material from a desired area using one of electron-beam lithography, photolithography, mechanical indentation, atomic force microscope lithography and scanning tunneling microscope lithography.

5. The method of claim 1 wherein said step of forming the second SAM comprises a step of depositing the second material from a solution.

6. The method of claim 2 further comprising the step of selecting said first material to comprise molecules with at least two thiol groups.

7. The method of claim 6 further comprising the step of selecting said first material to comprise alkyl chains attached to either thiol having not more than six consecutive carbon atoms.

8. The method of claim 7 further comprising the step of selecting said first material to comprise pentaerythritol-tetrakis (3-mercaptopropionate) molecules.

9. The method of claim 7 further comprising the step of selecting said second material to comprise a thiol having at least 7 consecutive carbon atoms.

10. The method of claim 7 further comprising the step of selecting said second material to comprise eicosanethiol.

11. The method of claim 10 further comprising the step of selecting said layer is selected to comprise gold and said step of etching is performed in a solution of cyanide containing oxygen and having a pH of approximately 12.

12. The method of claim 10 further comprising the step of selecting said layer to comprise copper and said step of etching is performed in a solution of peroxodisulfate.

13. The method of claim 2 further comprising the step of selecting said first material to comprise cysteamine (HS—$CH_2$—$CH_2$—$NH_2$.HCl) and the stamp surface is provided in a hydrophylized state.

14. The method of claim 13 further comprising the step of selecting said layer to comprise copper and said step of etching is performed in a solution of peroxodisulfate.

15. The method of claim 13 further comprising the step of selecting said layer to comprise gold and said step of etching is performed in a solution of cyanide containing oxygen and having a pH of approximately 12.

* * * * *